United States Patent
von Campenhausen et al.

(10) Patent No.: US 7,203,883 B2
(45) Date of Patent: Apr. 10, 2007

(54) INTEGRATED CIRCUIT

(75) Inventors: Aurel von Campenhausen, Cluvenhagen (DE); Marcin Gnat, Mering (DE); Joerg Vollrath, Olching (DE); Ralf Schneider, München (DE)

(73) Assignee: Infineon Technologies AG, Munich (DE)

( * ) Notice: Subject to any disclaimer, the term of this patent is extended or adjusted under 35 U.S.C. 154(b) by 196 days.

(21) Appl. No.: 11/086,655

(22) Filed: Mar. 23, 2005

(65) Prior Publication Data

US 2005/0229054 A1 Oct. 13, 2005

(30) Foreign Application Priority Data

Mar. 24, 2004 (DE) ...................... 10 2004 014 454

(51) Int. Cl.
*G06F 11/00* (2006.01)

(52) U.S. Cl. ...................... 714/745; 324/120

(58) Field of Classification Search ............ 324/76.11, 324/117 H, 127, 120; 327/31; 714/745
See application file for complete search history.

(56) References Cited

U.S. PATENT DOCUMENTS

| | | | | |
|---|---|---|---|---|
| 4,161,691 A | * | 7/1979 | Vermeers | 324/120 |
| 4,460,867 A | * | 7/1984 | Fleissner | 324/117 H |
| 4,639,665 A | * | 1/1987 | Gary | 324/117 H |
| 4,961,049 A | * | 10/1990 | Ghislanzoni | 324/117 H |
| 5,146,156 A | * | 9/1992 | Marcel | 324/127 |
| 5,581,204 A | * | 12/1996 | Olsen | 327/31 |
| 2003/0221149 A1 | | 11/2003 | Vollrath | |

* cited by examiner

*Primary Examiner*—David Ton
(74) *Attorney, Agent, or Firm*—Edell, Shapiro & Finnan, LLC

(57) ABSTRACT

An integrated semiconductor memory, which can be operated in a normal operating state and a test operating state, includes a current pulse circuit with an input terminal for applying an input signal. The current pulse circuit is connected to an output terminal via an interconnect for carrying a current. In the test operating state, the current pulse circuit generates at least one first current pulse with a first, predetermined time duration in a first test cycle and at least one second current pulse with a second, unknown time duration in a subsequent second test cycle. In addition to a first current flowing on the interconnect in the normal operating state, a second current flows on the interconnect during the first test cycle and a third current flows during the second test cycle in the test operating state.

32 Claims, 5 Drawing Sheets

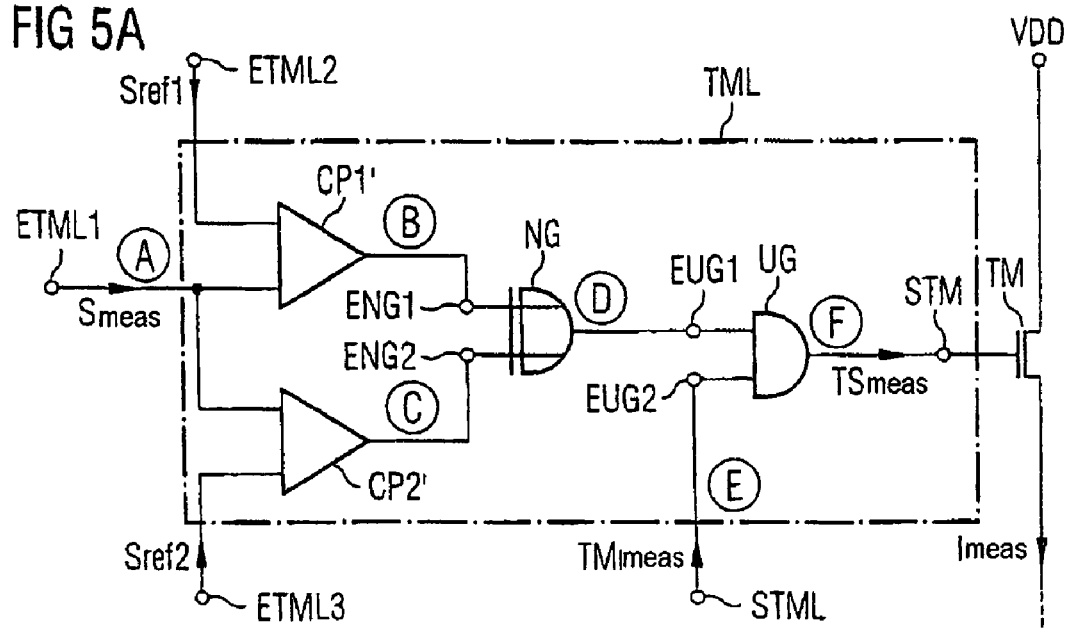
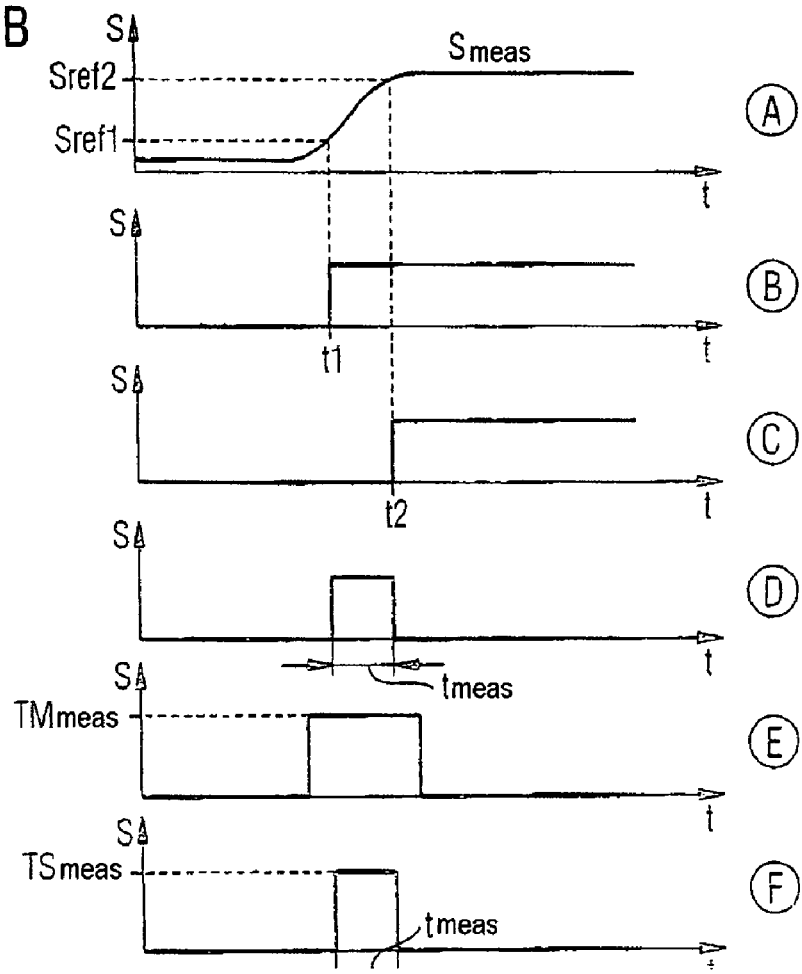

INTEGRATED CIRCUIT

CROSS REFERENCE TO RELATED APPLICATIONS

This application claims priority under 35 USC § 119 to German Application No. DE 10 2004 014 454.0, filed on Mar. 24, 2004, and titled "Integrated Circuit," the entire contents of which are hereby incorporated by reference.

FIELD OF THE INVENTION

The invention relates to an integrated circuit for determining a time duration of an internal operating operation of the integrated circuit.

BACKGROUND

In order to ensure correct functioning of an integrated semiconductor memory, for example, a DRAM (Dynamic Random Access Memory) semiconductor memory, it is essential to monitor internal time sequences within the integrated semiconductor memory. The time durations to be monitored may be, for example, delay times generated by circuit components of the integrated semiconductor memory during individual successive operating operations of the semiconductor memory. Furthermore, a specific time duration is required to elapse during operating operations such as, for example, read accesses to a memory cell or the turn-on of selection transistors of a memory cell.

If a logic information item is intended to be stored in a DRAM memory cell, then the selection transistor of the memory cell has to be turned on for a certain time until electrodes of a storage capacitor have been charged to a specific voltage. When reading from a memory cell, the charge state on the storage capacitor alters the potential of a connected bit line. However, the change in potential on the bit line becomes apparent only after a certain delay time has elapsed, so that a connected sense amplifier can be activated, for example, only after this time has elapsed.

Many of the internal chip times of interest can currently only be measured at the wafer level. This is due to the fact that the measurement locations on the integrated semiconductor chip are only accessible when the housing is open. Furthermore, complex test systems are required for measuring the time sequences that are becoming ever shorter. Such test systems are generally very expensive and continually have to be replaced by newer, faster test systems in the course of the rapid development in the semiconductor memory market.

SUMMARY OF THE INVENTION

An integrated circuit with which internal chip times can be determined easily at the wafer and component level without the use of complex measuring systems, which can be operated in a normal operating state and in a test operating state, includes an output terminal for application of a reference potential, a current pulse circuit with an input terminal for application of an input signal, and an interconnect for carrying a current. The current pulse circuit is connected to the output terminal via the interconnect. In this case, the current pulse circuit generates a first current pulse of a first time duration in a first test cycle of the test operating state and a second current pulse of a second time duration in a second test cycle of the test operating state on the output side. The second time duration is dependent on the temporal profile of the input signal. In the normal operating state, a first current flows on the interconnect. In the test operating state, a second current flows during the first test cycle and a third current flows during the succeeding second test cycle. The second current is a superposition of the first current and the first current pulse, and the third current is a superposition of the first current and the second current pulse.

In accordance with the invention, the integrated circuit includes a control clock. In this configuration, the current pulse circuit generates a plurality of first current pulses on the output side. Each has a temporal interval of a third time duration in the first test cycle of the test operating state, during a number of clock cycles of the control clock. Further, the current pulse circuit generates a plurality of second current pulses on the output side. Each has the temporal interval of the third time duration in the second test cycle of the test operating state, during the same number of clock cycles of the control clock as in the first test cycle.

The current pulses with first and second time durations bring about a current change or a current increase on the interconnect. This makes it possible, therefore, to deduce the unknown second time duration by generating a current change within the integrated circuit. In this case, the second time duration of the second current pulse is proportional to the current change on the interconnect. It thus becomes possible to determine short time durations by longer term current changes. Therefore, complicated test systems are not required for measuring the current changes. Since the current change constitutes a slow process, fast test systems are not required.

According to a further feature of the invention, the integrated circuit includes an input terminal for applying a supply potential and a circuit component with a resistor. The input terminal for applying the supply voltage is connected to the output terminal for applying the reference potential via the circuit component in the normal operating state and in the test operating state.

In one embodiment according to the invention, the integrated circuit includes an input terminal of the current pulse circuit for applying the supply potential, a first pulse generator circuit for generating a first control pulse with the first time duration, and a second pulse generator circuit for generating a second current pulse with the second time duration. Furthermore, the integrated circuit includes a first controllable switch with a control terminal. The first control pulse is fed to the control terminal and a second controllable switch with a control terminal. The second control pulse is fed to the control terminal. The input terminal of the current pulse circuit, in the first test cycle of the test operating state, is connected to the interconnect via the first controllable switch, which is turned on during the first time duration. The input terminal of the current pulse circuit, in the second test cycle of the test operating state, is connected to the interconnect via the second controllable switch, which is turned on during the second time duration.

Therefore, it is not necessary to provide a dedicated interconnect for carrying the first, second, and third currents. Rather, one interconnect is used for carrying the currents, which is used with other circuit components that are, for example, used in the normal operating state of the integrated circuit. The first current is, in this case, a quiescent current that flows on the interconnect.

In another embodiment of the integrated circuit, the first pulse generator circuit includes a control terminal for applying a first control signal. In this case, the first pulse generator circuit generates at least one of the first control pulses on the output side upon application of the first control signal in the first test cycle of the test operating state. The first current pulses generated by the first pulse generator circuit are current pulses with a known reference time.

In a further design of the integrated circuit, the second pulse generator circuit includes a control terminal for applying a second control signal. The second pulse generator circuit generates at least one of the second control pulses on the output side upon application of the second control signal in the second test cycle of the test operating state.

In another variation, the second pulse generator circuit includes a first input terminal for applying of an input signal and a second input terminal for applying of a reference signal. In this case, the second pulse generator circuit is designed such that the second time duration of the second control pulse corresponds to a time duration during which a level of the input signal lies above a level of the reference signal.

In one implementation of the pulse generator circuit of the integrated circuit, the input signal and the reference signal is fed to a comparator circuit on the input side. The comparator circuit is connected to a first input terminal of an AND gate on the output side. The control terminal of the second pulse generator circuit is connected to a second input terminal of the AND gate. The AND gate is connected to the control terminal of the second controllable switch on the output side.

In another implementation form of the integrated circuit, the second pulse generator circuit includes a first input terminal for applying an input signal, a second input terminal for applying a first reference signal, and a third input terminal for applying a second reference signal. The second pulse generator circuit is designed such that the second time duration of the second control pulse corresponds to a time duration during which a level of the input signal lies between a level of the first reference signal and a level of the second reference signal.

In one implementation of the second pulse generator circuit of the integrated circuit, the input signal and the first reference signal are fed to a first comparator circuit on the input side. The input signal and the second reference signal are fed to a second comparator circuit on the input side. The first comparator circuit is connected to a first input terminal of a multivibrator on the output side. Furthermore, the second comparator circuit is connected to a second input terminal of the multivibrator on the output side. The multivibrator is connected to the first input terminal of an AND gate on the output side. The control terminal of the second pulse generator circuit is connected to a second input terminal of the AND gate. The AND gate is finally connected to the control terminal of the second controllable switch on the output side.

In one implementation of the integrated circuit, the multivibrator is a flip-flop circuit.

According to another feature of the integrated circuit according to the invention, the first and second comparator circuits each generate a short pulse on the output side, if a level of the input signal reaches a level of the respective reference signal of the comparator circuits.

In another embodiment of the second pulse generator circuit of the integrated circuit, the input signal and the first reference signal are fed to a first comparator circuit on the input side. The input signal and the second reference signal are fed to a second comparator circuit on the input side. The first comparator circuit is connected to a first input terminal of a NOR gate on the output side. The second comparator circuit is connected to a second input terminal of the NOR gate on the output side. The NOR gate is connected to the first input terminal of an AND gate on the output side. The control terminal of the second pulse generator circuit is connected to a second input terminal of the AND gate. The AND gate is connected to the control terminal of the second controllable switch on the output side.

In a further embodiment of the integrated circuit, the first and second comparator circuits each generate a state change of an output signal on the output side, if a level of the input signal reaches a level of the respective reference signal of the comparator circuits.

In one implementation of the integrated circuit, the integrated circuit has control terminals for applying of control signals and the control clock the integrated circuit further includes a control circuit for controlling the integrated circuit in the normal operating state and in the test operating state. The control circuit is connected to the control terminals. The control circuit activates the test operating state of the integrated circuit upon application of a signal combination including the control signals and the control clock.

In one development of the integrated circuit, the first control signal generated by the control circuit on the output side are fed to the control terminal of the first pulse generator circuit. The second control signal generated by the control circuit on the output side are fed to the control terminal of the second pulse generator circuit.

The first and second control switches may each be a switching transistor. In this implementation, the switching transistor is designed to be able to switch within the first and second time duration. For example, n-channel transistors with a low threshold voltage and a short gate length are used.

In the embodiments described above, the integrated circuit is, for example, part of an integrated semiconductor memory.

A method for measuring a time duration of an internal operating operation of an integrated circuit is also provided. In the method according to the invention, a first current is generated, which, for example, may be a quiescent current generated by circuit components connected to the interconnect. The current intensity of the first current is subsequently measured at an output terminal of the integrated circuit. In a succeeding first test cycle of a test operating state of the integrated circuit, at least one first current pulse having a first time duration is activated. The current pulse or a plurality of current pulses generate a second current on the interconnect. The current intensity of the second current is measured at the output terminal. Afterward, in a succeeding second test cycle of the test operating state, at least one second current pulse has a second time duration is generated. The current pulse or a plurality of current pulses generate a third current on the interconnect. The current intensity of the third current is measured at the output terminal. The second time duration is thereupon determined with the formation of a quotient of current intensity differences in the first, second, and third currents.

In one development of the method for measuring a time duration of an internal operating operation of an integrated circuit, the first current is generated at the output terminal as a current, which arises as a result of applying a supply potential at an input terminal of the integrated circuit and a reference potential at the output terminal of the integrated circuit. The second current is generated at the output terminal as a summation current, which arises from the first current and at least one of the first current pulses of the current pulse circuit. The third current is finally generated at the output terminal as a summation current, which arises from the first current and at least one of the second current pulses of the current pulse circuit.

According to the concept according to the invention of the method for measuring a time duration of an internal operating operation of the integrated circuit, a quotient of a first current difference between the third and first currents and of a second current difference between the second and first currents is generated. The second time duration of the second current pulse is then determined by multiplying the quotient of the first and second current differences by the first time duration of the first current pulse.

BRIEF DESCRIPTION OF THE DRAWINGS

The invention is explained in more detail below based on exemplary embodiments illustrated in the figures, in which:

FIG. 5A shows a third embodiment of a pulse generator circuit according to the invention, and FIG. 5B shows the generation of a control pulse of the third embodiment of the pulse generator circuit according to the invention.

DETAILED DESCRIPTION

Figure 1:
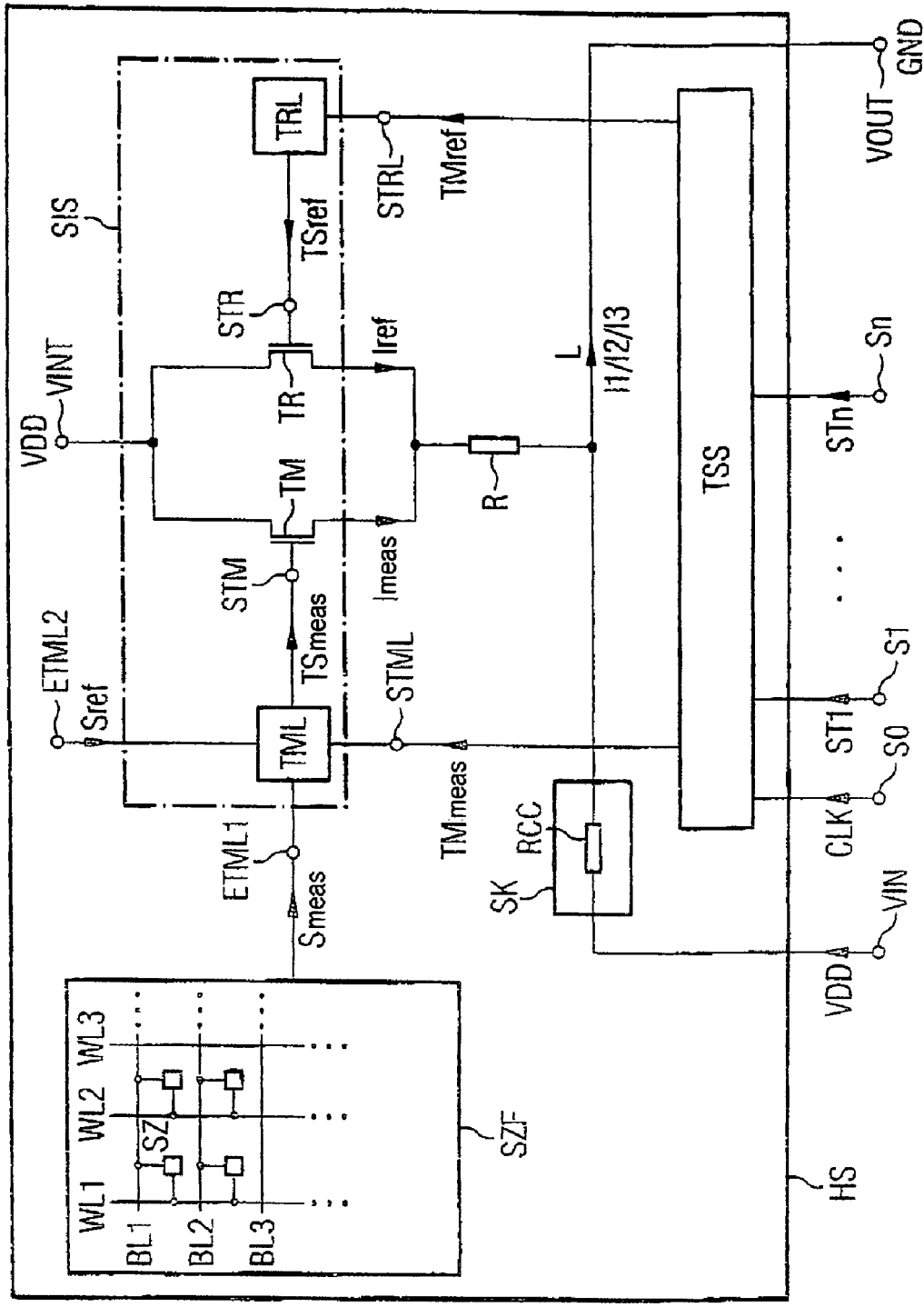
FIG. 1 shows an integrated semiconductor memory having an integrated circuit for determining internal chip times according to the invention.

FIG. 1 shows an integrated semiconductor memory HS with an integrated circuit. The integrated circuit of the semiconductor memory includes a memory cell array SZF, a current pulse circuit SIS for generating current pulses Iref and Imeas, a control circuit TSS for controlling the integrated circuit or the integrated semiconductor memory, and an interconnect L for carrying a current. Within a memory cell array, for example, a DRAM memory cell array. The memory cells SZ are arranged in matrix form between horizontally running bit lines BL1, BL2, BL3 and vertically running word lines WL1, WL2, WL3. For measuring internal chip times which occur within the memory cell array SZF, the memory cell array SZF is connected to a first input terminal ETML1 of the current pulse circuit SIS. Internal times occurring in the memory cell array SZF are, for example, charging times required for the storage capacitor of a memory cell SZ to be charged to a specific voltage level, or, for example, precharge lines required to charge the bit lines to an equalization potential after a write or read access.

The current pulse circuit SIS includes a supply terminal VINT for applying a supply potential VDD. Furthermore, the current pulse includes a first pulse generator circuit TRL for generating a first control pulse TSref and a second pulse generator circuit TML for generating a second control pulse TSmeas. The first pulse generator circuit TRL is controlled via a control terminal STRL for applying a first control signal TMref. It generates a control signal TSref on the output side, which is fed to a control terminal STR of a first controllable switch TR. The controllable switch TR is designed as a switching transistor in the exemplary embodiment of FIG. 1. The terminal VINT for applying the supply potential VDD is connected to the interconnect L via the controllable path of the switching transistor TR and a resistor R. The second pulse generator circuit TML is controlled via a control terminal STML for applying a second control signal TMmeas. The second pulse generator circuit TML furthermore includes a first input terminal ETML1 for applying an input signal Smeas and a second input terminal ETML2 for applying a reference signal Sref. The second pulse generator circuit TML generates a second control pulse TSmeas on the output side and feeds it to a control terminal STM of a second controllable switch TM. The second controllable switch TM is designed as a switching transistor in the exemplary embodiment of FIG. 1. The supply terminal VINT for applying the supply potential VDD is connected to the interconnect L via the controllable path of the switching transistor TM and the resistor R. The interconnect L is connected to an output terminal VOUT of the integrated semiconductor memory for applying a reference potential GND, for example, a ground potential. Besides the current pulse circuit SIS, further circuit components SK are connected to the line L, which circuit components are illustrated as nonreactive resistance RCC in the embodiment of FIG. 1 for simplicity. The further circuit components SK are connected to an input terminal VIN for applying the supply potential VDD. The integrated semiconductor memory HS is furthermore provided with control inputs S0, S1, . . . , Sn for applying a control clock CLK and for applying control signals ST1, . . . , STn. The control terminals of the integrated semiconductor memory are connected to the control circuit TSS for controlling the integrating semiconductor memory. On the output side, the control circuit TSS generates the first control signal TMref, which is fed into the control terminal STRL of the first pulse generator circuit, and the second control signal TMmeas, which is fed into the output side to the control terminal STML of the second pulse generator circuit TML.

Figure 2:
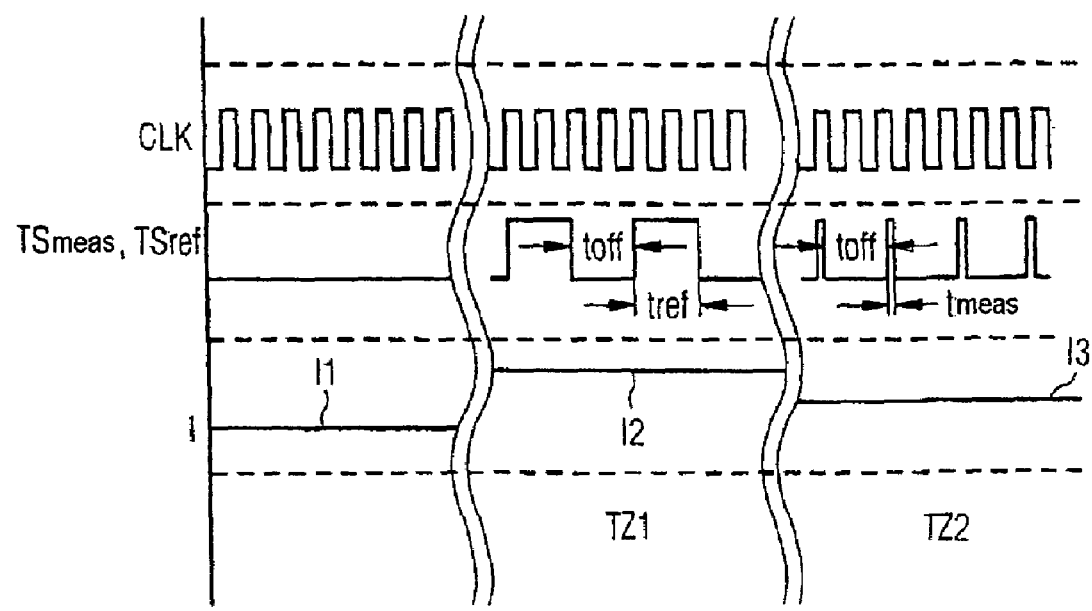
FIG. 2 shows the temporal profile of currents for determining the internal chip times according to the invention.

A description is given below, with reference to FIG. 2, of the functioning of the circuit components described in FIG. 1 for determining internal chip times. FIG. 2 shows the temporal profile of the control clock CLK, the profile of the first control pulse TSref, the profile of the second control pulse TSmeas and also the current I1, which flows on the interconnect L in a normal operating state of the integrated semiconductor memory, the current I2, which flows on the interconnect L during a first test cycle TZ1 in a test operating state of the integrated semiconductor memory, and also the current I3, which flows on the interconnect L during a second test cycle TZ2 in the test operating state of the integrated semiconductor memory.

The current pulse circuit SIS is deactivated in the normal operating state of the integrated semiconductor memory. In this state, no current pulses Iref and Imeas are generated. The quiescent current I1 flows on the interconnect L. The quiescent current is determined by the internal nonreactive resistance RCC of the circuit component SK. In order to determine internal chip times, the integrated semiconductor memory is switched from the normal operating state to the test operating state. For this purpose, a signal combination formed, for example, from state changes of the control clock CLK and the remaining control signals ST1, . . . , STn is applied to the control inputs S0, S1, . . . , Sn. If the control circuit TSS detects this characteristic signal combination at the control terminals, the control circuit operates the integrated semiconductor memory in the test operating state.

In the first test cycle of the test operating state, the control circuit drives the first pulse generator circuit TRL with the first control signal TMref. The first pulse generator circuit TRL thereupon generates control pulses TSref having a first, known time duration tref during a specific number of clock cycles of the control clock CLK. If the first control pulse has a high first level during the reference time tref, then the switching transistor TR is turned on during this time. During a subsequent third time duration toff, which may encompass a plurality of control clock cycles, the first pulse generator circuit TRL generates the first control signal TSref with a low signal level. As a result, the switching transistor TR is operated in the turned-off state during the third time duration toff. During the first test cycle TZ1, first current pulses Iref having the known first time duration tref thus arise on the line L at the temporal interval toff. If it is assumed that the quiescent current I1 continues to flow on the interconnect L, then a second current I2 including the quiescent current I1 and the first current pulses Iref having the time duration tref arises on the interconnect L in the first test cycle of the test operating state. FIG. 2 shows the second current I2 averaged over a plurality of clock cycles in the first test cycle of the test operating state.

As soon as the current I2 has stabilized after a specific number of clock cycles, a second test cycle of the test operating state is activated by the control circuit TSS. In this second test cycle of the test operating state, the first pulse generator circuit TRL no longer generates current pulses Iref. Instead, the control circuit TSS drives the second pulse generator circuit TML by the second control signal TMmeas. The second pulse generator circuit TML thereupon generates second control pulses TSmeas and feeds them to the control terminal STM of the switching transistor TM. The switching transistor TM is thereupon turned on for the second, unknown time duration Tmeas. As a result, the current pulse circuit SIS generates second current pulses Imeas having the second, unknown time duration tmeas on the output side. A plurality of the second current pulses Imeas temporally succeed one another at the temporal interval toff, like the current pulses Iref. A current I3 composed of the quiescent current I1 and the second current pulses Imeas averaged over a plurality of clock cycles thus arises on the interconnect L.

The temporal interval between the first current pulses Iref of the first test cycle and the second current pulses Imeas of the second test cycle is of the same magnitude. Likewise, the number of clock cycles during which the first current pulses of the first test cycle and the second current pulses of the second test cycle are generated is of the same magnitude.

The time duration tmeas of the second current pulses Imeas is the unknown internal chip time to be determined. If the time duration tref of the first current pulses Iref is known, then the unknown internal chip time tmeas can be determined by the quiescent current I1 measured at the output terminal VOUT, the second current I2 measured during the first test cycle TZ1 and the current I3 measured during the second test cycle TZ2. For this purpose, the difference between the current I2 and the current I1 is put into a ratio with the difference between the current I3 and the quiescent current I1. This current ratio corresponds to the ratio of the first time duration tref of the first current pulses Iref to the unknown time duration tmeas of the second current pulses Imeas.

$$\frac{I2-I1}{I3-I1} = \frac{tref}{tmeas}$$

The internal chip time tmeas sought can be determined as $$tmeas = tref \times \frac{I3-I1}{I2-I1}$$

Figure 3A:
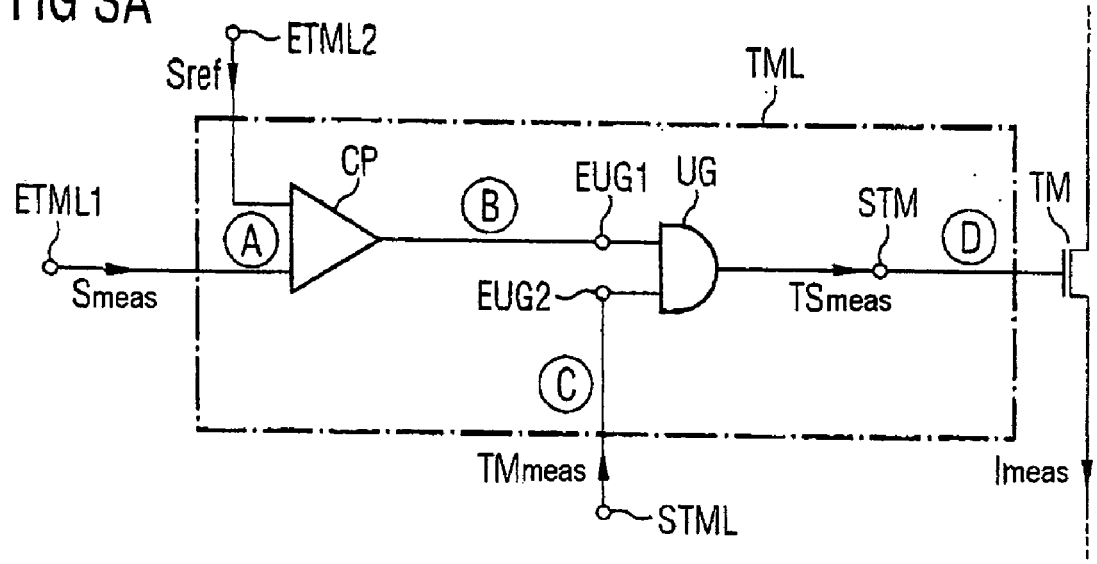
FIG. 3A shows a first embodiment of a pulse generator circuit according to the invention.

FIG. 3A shows a first embodiment of the second pulse generator circuit TML. The second pulse generator circuit TML includes, as illustrated in FIG. 1, a first input terminal ETML1 for applying an input signal Smeas and a second input terminal ETML2 for applying a reference signal Sref. The two input signals Smeas and Sref are fed to a comparator circuit CP on the input side. The comparator circuit CP is connected to a first input terminal EUG1 of an AND gate UG on the output side. The second pulse generator circuit TML furthermore has a control terminal STML for applying a second control signal TMmeas. The control signal is fed to a second input terminal EUG2 of the AND gate UG. The AND gate UG generates a second control pulse TSmeas on the output side and feeds the second control pulse TSmeas to the control terminal STM of the switching transistor TM.

Figure 3B:
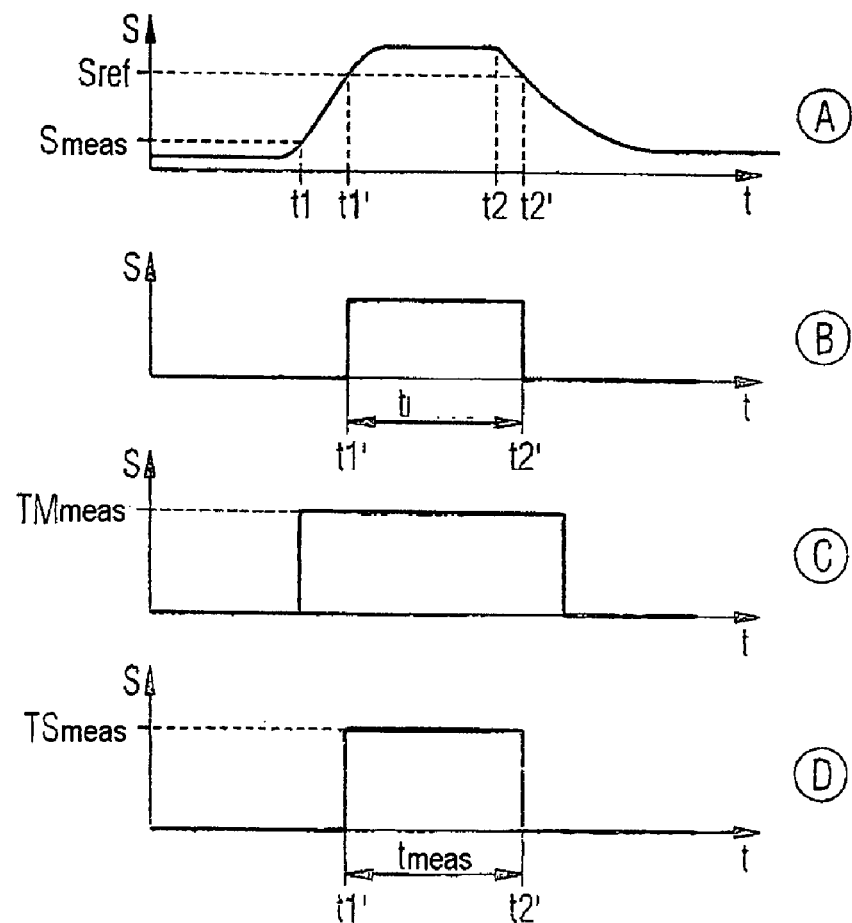
FIG. 3B shows the generation of a control pulse of the pulse generator circuit of the first embodiment.

FIG. 3B shows signal profiles within the second pulse generator circuit TML at the measurement locations A, B, C and D depicted in FIG. 3A. The first diagram of FIG. 3B illustrates the signal profile of the input signal Smeas and of the reference signal Sref at the input of the comparator circuit CP. At an instant t1, the input signal Smeas changes from a low signal level to a high signal level and changes to the low signal level again at the instant t2. The signal level of the input signal Smeas lies above a signal level of the reference signal Sref between an instant t1' and t2'. In this example, the time between the instant t1' and the instant t2' is the internal chip time tmeas to be determined. As can be seen from the second diagram, the comparator circuit CP generates, on the output side, a control pulse having the time duration tmeas between the time markers t1' and t2' if the level of the input signal Smeas lies above the level of the reference signal Sref. The third diagram illustrates the profile of the second control signal TMmeas generated by the control circuit TSS. The second pulse generator circuit TML is activated during the time duration of this control signal. The AND gate UG then supplies the second control pulse TSmeas having the time duration tmeas on the output side. In this case, the time duration tmeas corresponds to the unknown internal chip time to be measured. The switching transistor TM is turned on during this time, so that the current pulse circuit SIS generates, on the output side, the second current pulse having the unknown second time duration tmeas. Depending on the pulse duration of the second control signal TMmeas generated by the control circuit TSS, the second pulse generator circuit TML is activated, so that a plurality of first current pulses Imeas can also be generated thereby.

The first embodiment of a second pulse generator circuit as illustrated in FIG. 3A is suitable for determining a time duration during which the signal level of an input signal lies above the signal level of a reference signal.

Figure 4A:
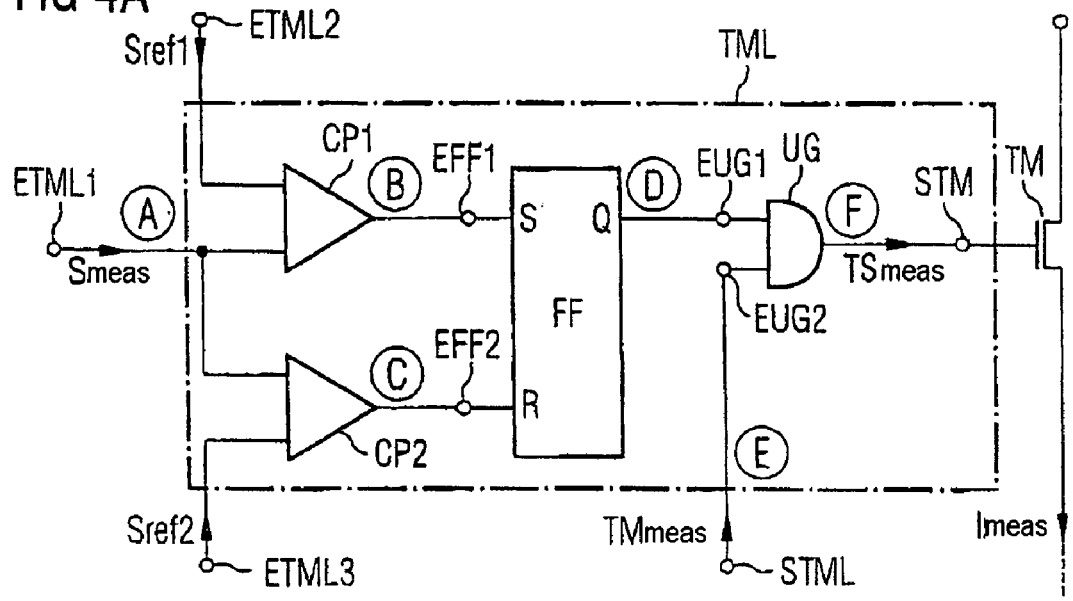
FIG. 4A shows a second embodiment of a pulse generator circuit according to the invention.

The second embodiment of the second pulse generator circuit as illustrated in FIG. 4A and the third embodiment of the pulse generator circuit as illustrated in FIG. 5A are suitable for determining an unknown time duration during which the level of an input signal rises from a first reference level Sref1 to a second reference level Sref2.

The second embodiment of a second pulse generator circuit TML, as illustrated in FIG. 4A, includes a first input terminal ETML1 for applying an input signal Smeas and also a second and third input terminal ETML2 and ETML3 for applying a first reference signal Sref1 and a second reference signal Sref2. The first input terminal ETML1 and the second input terminal ETML2 are connected to the input side of a first comparator circuit CP1. On the output side, the first comparator circuit CP1 is connected to a first input terminal EFF1 of a multivibrator, for example, a flip-flop circuit FF. The input signal Smeas and the second reference signal Sref2 are fed to the second comparator circuit CP2 on the input side. On the output side, the second comparator circuit is connected to a second input terminal EFF2 of the multivibrator FF. On the output side, the multivibrator FF is connected to a first input terminal EUG1 of an AND gate UG. The second control signal TMmeas is fed to a second input terminal EUG2 of the AND gate UG by the control circuit TSS via a control terminal STML. On the output side, the AND gate UG generates the second control pulse TSmeas and feeds the second control pulse TSmeas to the control terminal STM of the switching transistor TM.

Figure 4B:
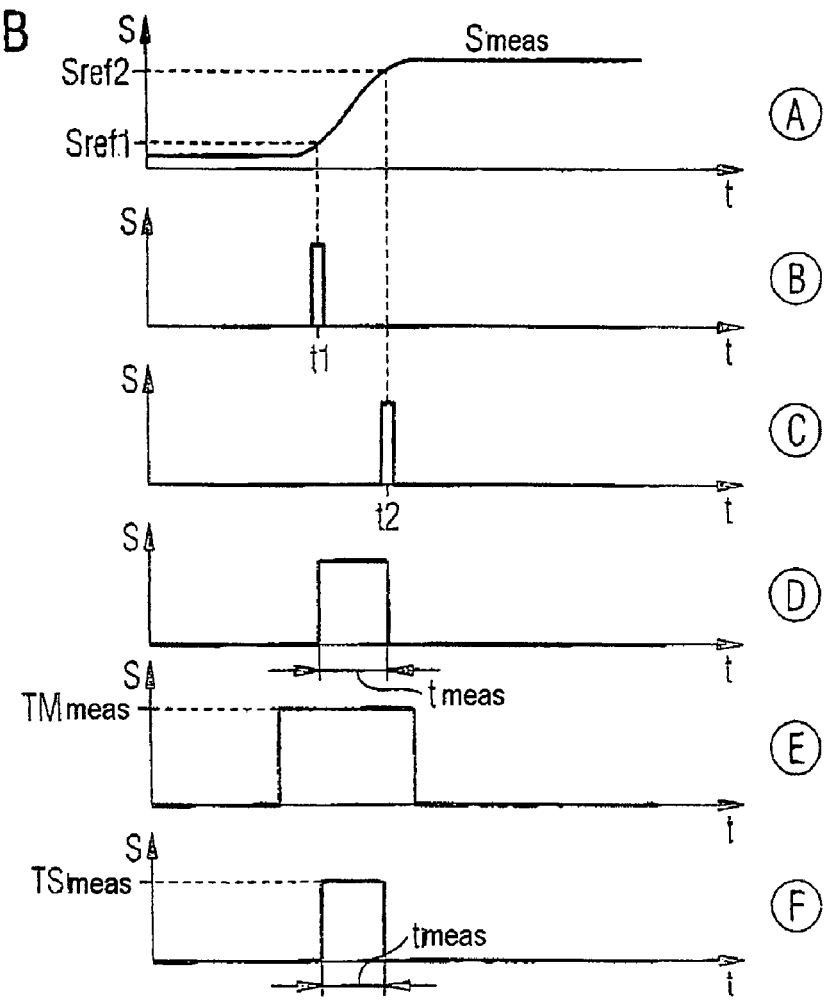
FIG. 4B shows the generation of a control pulse of the second embodiment of the pulse generator circuit according to the invention.

FIG. 4B shows signal profiles within the second embodiment of the second pulse generator circuit of FIG. 4A at measurement locations A, B, C, D, E and F depicted in FIG. 4A. The first diagram of FIG. 4B shows the temporal profile of the input signal Smeas. The input signal Smeas changes from a low level to a high level. In this case, the signal level of the input signal Smeas intercepts the signal level Sref1 of the first reference signal at an instant t1 and the signal level of the second reference signal Sref2 at an instant t2. The comparator circuits CP1 and CP2 are designed to generate a short pulse on the output side, if the signal levels applied on the input side have the same signal amplitudes. The second diagram illustrates the pulse generated at the instant t1 by the first comparator circuit CP1 on the output side at the measurement location B if the level of the input signal Smeas intersects the level of the first reference signal Sref1. The third diagram shows the pulse generated by the second comparator circuit CP2 on the output side at the measurement location C. The signal generated by the flip-flop circuit FF on the output side on the measurement location D is illustrated in the fourth signal diagram. The flip-flop circuit FF toggles on the output side from a first state to a second state as soon as one of the input signals applied at the input terminals EFF1 and EFF2 has a state change. The flip-flop circuit therefore toggles on the output side to a high signal level, for example, at the instant t1 when the pulse generated by the first comparator circuit occurs, and toggles to the low signal level again at the instant t2 if the input signal applied at the second input terminal EFF2 has a pulse. The time duration while the flip-flop generates the high signal level on the output side corresponds to the unknown chip time tmeas to be determined. In order to activate the second pulse generator circuit, the second control signal TMmeas illustrated in the fifth diagram is fed to the control terminal STML. The AND gate UG thereupon generates, on the output side, the control pulse TSmeas with the time duration Tmeas during which the switching transistor TM is turned on. The current pulse circuit thus generates the second current pulse Imeas with the unknown second time duration tmeas. It is thus possible to generate a plurality of current pulses Imeas with the time duration tmeas depending on the pulse duration of the second control signal TMmeas.

FIG. 5A shows a third embodiment of the second pulse generator circuit TML according to the invention. The circuit has a first input terminal ETML 1 for applying an input signal Smeas, a second input terminal ETML2 for applying a first reference signal Sref1 and a third input terminal ETML3 for applying a second reference signal Sref2. The input signal Smeas and the first reference signal Sref1 are fed to the input side of a first comparator circuit CP1'. Furthermore, the input signal Smeas and also the second reference signal Sref2 are fed to an input side of a second comparator circuit CP2'. The first comparator circuit CP1' is connected to a first input terminal ENG1 of a NOR gate NG on the output side. The second comparator circuit CP2' is connected to a second input terminal ENG2 of the NOR gate NG on the output side. The NOR gate NG is connected to a first input terminal EUG1 of an AND gate UG on the output side. The second control signal TMmeas of the control circuit TSS can be fed to a second input terminal EUG2 of the AND gate UG via the control terminal STML. The AND gate UG generates the second control pulse TSmeas on the output side and feeds it to the control terminal STM of the switching transistor TM.

FIG. 5B shows signal profiles within the third embodiment of the second pulse generator circuit of FIG. 5A, at the measurement locations A, B, C, D, E and F depicted in FIG. 5A. The signal profile of the input signal Smeas illustrated in the first diagram of FIG. 5B corresponds to the profile of the input signal Smeas of FIG. 4B. The comparator circuits CP1' and CP2' used in FIG. 5A generate a state change on the output side if the level of the input signal Smeas reaches the level of the respective reference signal Sref1 or Sref2. This output-side state change of the first and second comparator circuits is illustrated in the second and third diagrams. The NOR gate NG thereupon generates a pulse having the second time duration tmeas on the output side. Through activation of the second pulse generator circuit TML with the second control signal TMmeas, the AND gate UG generates the second control pulse TSmeas with the second, unknown time duration Tmeas to be determined. The switching transistor TM is thus turned on during the time duration tmeas, so that the current pulse circuit SIS generates a second current pulse Imeas having the unknown second time duration tmeas on the output side. With the third embodiment of the second pulse generator circuit, it is possible for a plurality of current pulses Imeas with the unknown second time duration tmeas to be generated depending on the pulse duration of the second control signal TMmeas.

Alternatively, the first pulse generator circuit TRL can be designed according to an embodiment demonstrated in FIGS. 3A, 4A and 5A. Instead of the input signal Smeas whose temporal profile is unknown, in this case a further reference signal having a known temporal profile is applied to the first input terminal ETML1. If the temporal profiles of the reference signals are known, first control pulses TSref with a predetermined reference time tref can be generated on the output side at the control terminal STM of the switching transistor TM. The first control pulses TSref with the time duration tref bring about the first current pulses Iref with the previously known time duration tref because the switching transistor TR is turned on by the first control pulses TSref during the time duration tref.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols: | |
|---|---|
| HS | Integrated semiconductor memory |
| SZF | Memory cell array |
| WL | Word line |
| BL | Bit line |
| Smeas | Input signal |
| SIS | Current pulse circuit |
| ETML | Input terminal of the current pulse circuit |
| Sref | Reference signal |
| TML, TRL | Pulse generator circuit |
| STML, STRL | Control terminal of the pulse generator circuit |
| TS | Control pulse |
| STM, STR | Control terminal of the controllable switch |
| TM, TR | Controllable switch |
| Iref | First current pulse |
| Imeas | Second current pulse |
| VINT | Internal supply terminal |
| VDD | Supply voltage |
| R, RCC | Resistor |
| SK | Circuit component |
| I | Current |
| L | Interconnect |
| TM | Control signal |
| TSS | Control signal |
| VIN | Input terminal |
| S | Control terminal |
| CLK | Control clock |
| ST | Control signal |
| VOUT | Output terminal |
| GND | Reference potential |
| TZ | Test cycle |
| tref | First time duration |
| tmeas | Second time duration |
| toff | Third time duration |
| UG | AND gate |
| EUG | Input terminal of the AND gate |
| NG | NOR gate |
| ENG | Input terminal of the NOR gate |
| CP | Comparator circuit |

What is claimed is:

1. An integrated circuit, which operates in a normal operating state and in a test operating state, comprising:
an output terminal (VOUT) for applying a reference potential (GND);
a current pulse circuit (SIS) with an input terminal (ETML1) for applying an input signal (Smeas); and
an interconnect (L) for carrying a current (I),
wherein the current pulse circuit (SIS) is connected to the output terminal (VOUT) via the interconnect (L), the current pulse circuit is designed, on the output side, to generate a first current pulse (Iref) with a first, predetermined time duration (tref) in a first test cycle (TZ1) of the test operating state and a second current pulse (Imeas) with a second, time duration (tmeas) in a second test cycle (TZ2) of the test operating state, the second time duration (tmeas) being dependent on the temporal profile of the input signal (Smeas), and in the normal operating state, a first current (I1) flows on the interconnect (L) and, in the test operating state, a second current (I2) flows during the first test cycle (TZ1) and a third current (I3) flows during the succeeding second test cycle (TZ2), the second current (I2) including a superposition of the first current (I1) and the first current pulse (Iref) and the third current (I3) including a superposition of the first current (I1) and the second current pulse (Imeas).

2. The integrated circuit as claimed in claim 1, further comprising:
a control clock (CLK),
wherein the current pulse circuit is designed, on the output side, to generate a plurality of first current pulses (Iref), each first current pulse having a temporal interval of a third time duration (toff), in the first test cycle (TZ1) of the test operating state, during a predetermined number of clock cycles of the control clock (CLK), and the current pulse circuit is designed, on the output side, to generate a plurality of second current pulses (Iref), each second current pulse having the temporal interval of the third time duration (toff) in the second test cycle (TZ2) of the test operating state, during the predetermined number of clock cycles of the control clock (CLK).

3. The integrated circuit as claimed in claim 1, further comprising:
an input terminal (VIN) for applying a supply potential (VDD); and
a circuit component (SK) with a resistance (RCC),
wherein the input terminal (VIN) for applying the supply voltage (VDD) is connected to the output terminal (VOUT) for applying the reference potential (GND) via the circuit component (SK) in the normal operating state and in the test operating state.

4. The integrated circuit as claimed in claim 3, wherein the first pulse generator circuit (TRL) includes a control terminal (STRL) for applying a first control signal (TMref), and the first pulse generator circuit (TRL) is designed to generate at least one of the first control pulses (TSref) on the output side on application of the first control signal (TMref) in the first test cycle (TZ1) of the test operating state.

5. The integrated circuit as claimed in claim 3, wherein the second pulse generator circuit (TML) includes a control terminal (STML) for applying a second control signal (TMmeas), and the second pulse generator circuit (TML) is designed to generate at least one of the second control pulses (TSmeas) on the output side upon application of the second control signal (TMmeas) in the second test cycle (TZ2) of the test operating state.

6. The integrated circuit as claimed in claim 5, wherein the second pulse generator circuit (TML) includes a first input terminal (ETML1) for applying an input signal (Smeas) and a second input terminal (ETML2) for applying a reference signal (Sref), and the second pulse generator circuit is designed such that the second time duration (tmeas) of the second control pulse (TMmeas) corresponds to a time duration during which a level of the input signal (Smeas) lies above a level of the reference signal (Sref).

7. The integrated circuit as claimed in claim 6, wherein the input signal (Smeas) and the reference signal (Sref) are fed to a comparator circuit (CP) on the input side, the comparator circuit (CP) is connected to a first input terminal (EUG1) of an AND gate (UG) on the output side, the control terminal (STML) of the second pulse generator circuit (TML) is connected to a second input terminal (EUG2) of the AND gate, and the AND gate is connected to the control terminal (STM) of the second controllable switch (TM) on the output side.

8. The integrated circuit as claimed in claim 5, wherein the second pulse generator circuit (TML) includes a first input terminal (ETML1) for applying an input signal (Smeas), a second input terminal (ETML2) for applying a first reference signal (Sref1), and a third input terminal (ETML3) for applying a second reference signal (Sref2), and the second pulse generator circuit is designed such that the second time duration (tmeas) of the second control pulse (TSmeas) corresponds to a time duration during which a level of the input signal (Smeas) lies between a level of the first reference signal (Sref1) and a level of the second reference signal (Sref2).

9. The integrated circuit as claimed in claim 8, wherein the input signal (Smeas) and the first reference signal (Sref1) are fed to a first comparator circuit (CP1) on the input side, the input signal (Smeas) and the second reference signal (Sref2) are fed to a second comparator circuit (CP2) on the input side, the first comparator circuit (CP1) is connected to a first input terminal (EFF1) of a multivibrator (FF) on the output side, the second comparator circuit (CP2) is connected to a second input terminal (EFF2) of the multivibrator (FF) on the output side, the multivibrator (FF) is connected to the first input terminal (EUG1) of an AND gate (UG) on the output side, the control terminal (STML) of the second pulse generator circuit (TML) is connected to a second input terminal (EUG2) of the AND gate, and the AND gate is connected to the control terminal (STM) of the second controllable switch (TM) on the output side.

10. The integrated circuit as claimed in claim 9, wherein the multivibrator (FF) is a flip-flop circuit (FF).

11. The integrated circuit as claimed in claim 9, wherein the first and second comparator circuits are designed to each generate a short pulse on the output side, if a level of the input signal (Smeas) reaches a level of the respective reference signal (Sref1, Sref2) of the comparator circuit (CP1, CP2).

12. The integrated circuit as claimed in claim 8, wherein the input signal (Smeas) and the first reference signal (Sref1) are fed to a first comparator circuit (CP1') on the input side, the input signal (Smeas) and the second reference signal (Sref2) are fed to a second comparator circuit (CP2') on the input side, the first comparator circuit (CP1') is connected to a first input terminal (ENG1) of a NOR gate (NG) on the output side, the second comparator circuit (CP2') is connected to a second input terminal (ENG2) of the NOR gate (NG) on the output side, the NOR gate (NG) is connected to the first input terminal (EUG1) of an AND gate (UG) on the output side, the control terminal (STML) of the second pulse generator circuit (TML) is connected to a second input terminal (EUG2) of the AND gate, and the AND gate is connected to the control terminal (STM) of the second controllable switch (TM) on the output side.

13. The integrated circuit as claimed in claim 12, wherein the first and second comparator circuits are designed to each generate a state change of an output signal on the output side, if a level of the input signal (Smeas) reaches a level of the respective reference signal (Sref1, Sref2) of the comparator circuits (CP1', CP2').

14. The integrated circuit as claimed in claim 3, wherein the first and second controllable switches (TR, TM) are each a switching transistor (TR, TM).

15. The integrated circuit as claimed in claim 1, further comprising:
    a supply terminal (VINT) of the current pulse circuit (SIS) for applying the supply potential (VDD);
    a first pulse generator circuit (TRL) for generating a first control pulse (TSref) having the first time duration (tref);
    a second pulse generator circuit (TML) for generating a second control pulse (TSmeas) having the second time duration (tmeas);
    a first controllable switch (TR) with a control terminal (STR), the first control pulse (TSref) being fed to the control terminal; and
    a second controllable switch (TM) with a control terminal (STM), the second control pulse (TSmeas) being fed to the control terminal,
    wherein the supply terminal (VINT) of the current pulse circuit (SIS), in the first test cycle (TZ1) of the test operating state, is connected to the interconnect (L) via the first controllable switch (TR), which is turned on during the first time duration (tref), and the supply terminal (VINT) of the current pulse circuit (SIS), in the second test cycle (TZ2) of the test operating state, is connected to the interconnect (L) via the second controllable switch (TM), which is turned on during the second time duration (tmeas).

16. The integrated circuit as claimed in claim 15, wherein the first pulse generator circuit (TRL) includes a control terminal (STRL) for applying a first control signal (TMref), and the first pulse generator circuit (TRL) is designed to generate at least one of the first control pulses (TSref) on the output side on application of the first control signal (TMref) in the first test cycle (TZ1) of the test operating state.

17. The integrated circuit as claimed in claim 15, wherein the second pulse generator circuit (TML) includes a control terminal (STML) for applying a second control signal (TMmeas), and the second pulse generator circuit (TML) is designed to generate at least one of the second control pulses (TSmeas) on the output side upon application of the second controls TMmeas) in the second test cycle (TZ2) of the test operating state.

18. The integrated circuit as claimed in claim 17, wherein the second pulse generator circuit (TML) includes a first input terminal (ETML1) for applying an input signal (Smeas) and a second input terminal (ETML2) for applying a reference signal (Sref), and the second pulse generator circuit is designed such that the second time duration (tmeas) of the second control pulse (TMmeas) corresponds to a time duration during which a level of the input signal (Smeas) lies above a level of the reference signal (Sref).

19. The integrated circuit as claimed in claim 18, wherein the input signal (Smeas) and the reference signal (Sref) are fed to a comparator circuit (CP) on the input side, the comparator circuit (CP) is connected to a first input terminal (EUG1) of an AND gate (UG) on the output side, the control terminal (STML) of the second pulse generator circuit (TML) is connected to a second input terminal (EUG2) of the AND gate, and the AND gate is connected to the control terminal (STM) of the second controllable switch (TM) on the output side.

20. The integrated circuit as claimed in claim 17, wherein the second pulse generator circuit (TML) includes a first input terminal (ETML1) for applying an input signal (Smeas), a second input terminal (ETML2) for applying a first reference signal (Sref1), and a third input terminal (ETML3) for applying a second reference signal (Sref2), and the second pulse generator circuit is designed such that the second time duration (tmeas) of the second control pulse (TSmeas) corresponds to a time duration during which a level of the input signal (Smeas) lies between a level of the first reference signal (Sref1) and a level of the second reference signal (Sref2).

21. The integrated circuit as claimed in claim 20, wherein the input signal (Smeas) and the first reference signal (Sref1) are fed to a first comparator circuit (CP1) on the input side, the input signal (Smeas) and the second reference signal (Sref2) are fed to a second comparator circuit (CP2) on the input side, the first comparator circuit (CP1) is connected to a first input terminal (EFF 1) of a multivibrator (FF) on the output side, the second comparator circuit (CP2) is connected to a second input terminal (EFF2) of the multivibrator (FF) on the output side, the multivibrator (FF) is connected to the first input terminal (EUG1) of an AND gate (UG) on the output side, the control terminal (STML) of the second pulse generator circuit (TML) is connected to a second input terminal (EUG2) of the AND gate, and the AND gate is connected to the control terminal (STM) of the second controllable switch (TM) on the output side.

22. The integrated circuit as claimed in claim 21, wherein the multivibrator (FF) is a flip-flop circuit (FF).

23. The integrated circuit as claimed in claim 21, wherein the first and second comparator circuits each generate a short pulse on the output side, if a level of the input signal (Smeas) reaches a level of the respective reference signal (Sref1, Sref2) of the comparator circuit (CP1, CP2).

24. The integrated circuit as claimed in claim 20, wherein the input signal (Smeas) and the first reference signal (Sref1) are fed to a first comparator circuit (CP1') on the input side, the input signal (Smeas) and the second reference signal (Sref2) are fed to a second comparator circuit (CP2') on the input side, the first comparator circuit (CP1') is connected to a first input terminal (ENG1) of a NOR gate (NG) on the output side, the second comparator circuit (CP2') is connected to a second input terminal (ENG2) of the NOR gate (NG) on the output side, the NOR gate (NG) is connected to the first input terminal (EUG1) of an AND gate (UG) on the output side, the control terminal (STML) of the second pulse generator circuit (TML) is connected to a second input terminal (EUG2) of the AND gate, and the AND gate is connected to the control terminal (STM) of the second controllable switch (TM) on the output side.

25. The integrated circuit as claimed in claim 24, wherein the first and second comparator circuits each generate a state change of an output signal on the output side, if a level of the input signal (Smeas) reaches a level of the respective reference signal (Sref1, Sref2) of the comparator circuits (CP1', CP2').

26. The integrated circuit as claimed in claim 15, wherein the first and second controllable switches (TR, TM) are each a switching transistor (TR, TM).

27. The integrated circuit as claimed in claim 1, further comprising:
control terminals (S0, S1, . . . , Sn) for applying control signals (ST1, . . . , STn) and of the control clock (CLK); and
a control circuit (TSS) for controlling the integrated circuit in the normal operating state and in the test operating state,
wherein the control circuit (TSS) is connected to the control terminals, the control circuit activates the test operating state of the integrated circuit upon application of a signal combination comprising the control signals and the control clock.

28. The integrated circuit as claimed in claim 27, wherein the first control signal (TMref) generated by the control circuit (TSS) on the output side is fed to the control terminal (STRL) of the first pulse generator circuit (TRL), and the second control signal (TMmeas) generated by the control circuit (TSS) on the output side is fed to the control terminal (STML) of the second pulse generator circuit (TML).

29. The integrated circuit as claimed in claim 28, wherein the first and second controllable switches (TR, TM) are each a switching transistor (TR, TM).

30. A method for measuring a time duration of an internal operating operation of an integrated circuit, comprising:
generating a first current (I1);
measuring a current intensity of the first current (I1) at an output terminal (VOUT) of the integrated circuit;
activating at least one first current pulse (Iref) with a first time duration (tref) in a first test cycle of a test operating state of the integrated circuit;
generating a second current (I2);
measuring the current intensity of the second current (I2) at the output terminal (VOUT);
activating at least one second current pulse (Imeas) with a second time duration (tmeas) in a second test cycle of the test operating state;
generating a third current (I3);
measuring the current intensity of the third current (I3) at the output terminal (VOUT); and
determining the second time duration (tmeas) with the formation of a quotient of current intensity differences in the first, second and third currents (I1, I2, I3).

31. The method for measuring a time duration of an internal operating operation of an integrated circuit as claimed in claim 30, further comprising:
generating the first current (I1) at the output terminal (VOUT) as a current which arises as a result of applying a supply potential (VDD) to an input terminal (VIN) of the integrated circuit and applying a reference potential (GND) at the output terminal (VOUT) of the integrated circuit;
generating the second current (I2) at the output terminal (VOUT) as a summation current, which arises from the first current (I1) and at least one of the first current pulses (Iref) of the current pulse circuit (SIS); and
generating the third current (I3) at the output terminal (VOUT) as a summation current, which arises from the first current (I1) and at least one of the second current pulses (Imeas) of the current pulse circuit (SIS).

32. The method for measuring a time duration of an internal operating operation of an integrated circuit as claimed in claim 30, further comprising:
generating a quotient of a first current difference between the third and first currents (I3, I1) and of a second current difference between the second and first currents (I2, I1); and
determining the second time duration (tmeas) of the second current pulse (Imeas) from multiplying the quotient of the first and second current differences by the first time duration (tref) of the first current pulse (Iref).

* * * * *